(12) United States Patent
Hayakawa et al.

(10) Patent No.: US 7,549,873 B2
(45) Date of Patent: Jun. 23, 2009

(54) ELECTRICAL JUNCTION BOX

(75) Inventors: Tatsuya Hayakawa, Yokkaichi (JP); Akira Baba, Yokkaichi (JP)

(73) Assignee: Sumitomo Wiring Systems, Ltd., Mie (JP)

(*) Notice: Subject to any disclaimer, the term of this patent is extended or adjusted under 35 U.S.C. 154(b) by 0 days.

(21) Appl. No.: 12/213,518

(22) Filed: Jun. 20, 2008

(65) Prior Publication Data

US 2009/0023307 A1  Jan. 22, 2009

(30) Foreign Application Priority Data

Jul. 17, 2007  (JP) .............................. 2007-186364

(51) Int. Cl.
*H01R 12/00* (2006.01)
(52) U.S. Cl. .................. 439/76.2; 439/34; 439/949
(58) Field of Classification Search .................. 439/34, 439/76.1, 76.2, 949
See application file for complete search history.

(56) References Cited

U.S. PATENT DOCUMENTS

| 6,215,101 | B1 | 4/2001 | Kondo et al. | |
| 6,560,840 | B1 | 5/2003 | Jenkins et al. | |
| 7,390,198 | B2 * | 6/2008 | Oka et al. | 439/76.2 |

FOREIGN PATENT DOCUMENTS

| JP | A-7-297562 | 11/1995 |
| JP | A-11-26959 | 1/1999 |
| JP | B2-3888368 | 2/2007 |

* cited by examiner

*Primary Examiner*—Javaid Nasri
(74) *Attorney, Agent, or Firm*—Oliff & Berridge, PLC

(57) ABSTRACT

An electrical junction box reduces the number of components to be contained in an electrical junction box and simplifies a structure of the box. The electrical junction box has a casing assembly including an upper casing and a lower casing. A laminated unit including bus bars and insulation plates is contained in the upper casing, while a first printed circuit board, a second printed circuit board and a spacer made of an insulation resin material are contained in the lower casing. The first printed circuit board is disposed on one side of the spacer, while the second printed circuit board is disposed on the other side of the spacer. Shorter size fixing bars and longer size fixing bars project from an inner surface on a top wall of the upper casing. The shorter size fixing bars penetrate the laminated unit, first printed circuit board and spacer. Screws are inserted upward into the shorter size fixing bars via through-holes in the spacer to secure the unit, first printed circuit board, and spacer to the shorter bars. Longer size fixing bars penetrate the laminated unit, first printed circuit board, spacer, second printed circuit board, and lower casing. Screws are inserted upward into the longer size fixing bars via through-holes in the lower casing to secure the unit, first and second printed circuit boards, spacer, and lower casing to the longer bars.

5 Claims, 7 Drawing Sheets

ELECTRICAL JUNCTION BOX

BACKGROUND

This disclosure relates to an electrical junction box to be mounted on a motor vehicle, and more particularly relates to an electrical junction box which contains printed circuit boards, can reduce a count of components to be contained, can simplify a construction, and can accomplish sliming and downsizing purposes.

An electrical junction box to be mounted on a motor vehicle is required for accommodating a plurality of printed circuit boards, on which electrical parts and electronic parts are mounted, together with conventional common laminated unit including bus bars and insulation plates, in association with a rapid increase of electrical parts to be mounted on the motor vehicle. Because parts to be mounted in the electrical junction box has increased, a construction of the electrical junction box has tended to be complicated and upsized For example, an electrical junction box disclosed in Japanese Patent No. 3888368, as shown in FIG. 6 of the present application, has a casing assembly including an upper casing 1, an intermediate casing 2, and a lower casing 3. A laminated unit 4 including bus bars and insulation plates is contained in an upper part of a space between the upper casing 1 and the intermediate casing 2, while a first printed circuit board 5 is contained in the lower part of the space. A multi functional interexchange unit 6 is disposed in a space between the intermediate casing 2 and the lower casing 3 and a relay unit 7 is disposed below the interexchange unit 6 in the space. The multi functional interexchange unit 6 is provided with a second printed circuit board 8 while the relay unit 7 is provided with a third printed circuit board 9.

The first, second, and third printed circuit boards 5, 8, and 9 are connected to one another through interexchange connectors provided in the multi functional interexchange unit 6.

In the electrical junction box constructed above, as schematically shown in FIG. 7, the intermediate casing 2 is disposed between the upper casing 1 and the lower casing 3 to form a casing assembly comprising three components. The first printed circuit board 5 is supported by the lowermost insulation plate of the laminated unit 4, the second printed circuit board 8 is supported by the multi functional interexchange unit 6, and the third printed circuit board 9 is supported by the relay unit 7. Since the printed circuit boards are supported by the different members, the number of components increases.

Thus, the increased number of components and complicated construction will upsize the electrical junction box and incur a very high cost.

SUMMARY

In view of the above problems, an object of the present disclosure is to provide an electrical junction box, in which a fixing mechanism of a plurality of printed circuit boards is improved, the number of components is significantly reduced, a whole structure is slimed and downsized, and a cost of production is reduced.

In order to overcome the above problems, the present disclosure is directed to an electrical junction box provided with a casing assembly including an upper casing and a lower casing. A laminated unit including bus bars and insulation plates may be contained in the upper casing, while a first printed circuit board, a second printed circuit board, and a spacer may be contained in the lower casing. The first printed circuit board may be disposed on one side of the spacer, while the second printed circuit board may be disposed on the other side of the spacer. Shorter size fixing bars and longer size fixing bars may project from an inner surface on a top wall of the upper casing. The shorter size fixing bars may penetrate the laminated unit, first printed circuit board, and spacer. Screws may be inserted upward into the shorter size fixing bars via through-holes in the spacer to secure the unit, first printed circuit board, and spacer to the shorter bars. Longer size fixing bars may penetrate the laminated unit, first printed circuit board, spacer, second printed circuit board, and lower casing. Screws may be inserted upward into the longer size fixing bars via through-holes in the lower casing to secure the unit, first and second boards, spacer, and lower casing to the longer bars.

According to the present disclosure, the casing assembly of the electrical junction box has two parts including the upper and lower casings and may not require an intermediate casing. A plurality of printed circuit boards may be disposed below the laminated unit including the bus bars and insulation plates (hereinafter referred to as a "bus bar laminated unit").

The first and second printed circuit boards disposed below the bus bar laminated unit, may be arranged on the opposite sides of a sheet of spacer, respectively. The spacer defines a clearance between the printed circuit boards to enable the electrical parts to be mounted on the opposite sides of each printed circuit board.

In particular, the printed circuit boards may be secured to the casing assembly by screws so that soldered portions connecting the terminals to each printed circuit board do not cause problems, such as cracks. That is, as described above, the shorter size and longer size fixing bars having different lengths may project from the inner surface of the uppercasing. The shorter size fixing bars may be secured to the spacer disposed below the first printed circuit board by the screws. Consequently, the first printed circuit board may be positioned and secured below the bus bar laminated unit. Since the screw-fastening load is applied to the spacer, the load does not affect the first printed circuit board directly.

On the other hand, the longer size fixing bars penetrate the first printed circuit board, spacer, second printed circuit board, lower casing and are secured to the lower casing by the screws. Accordingly, the screw-fastening load may not be applied to the second printed circuit board directly.

Thus, the first and second printed circuit boards are positioned away from each other through the spacer and positioned and secured in the casing assembly so that the screw-fastening load affects the printed circuit boards directly. Accordingly, it is possible to surely prevent the soldered portions on the printed circuit boards from causing the problems, such as cracks, due to the screw-fastening load. It is also possible to reduce a count of components in the electrical junction box, to reduce the thickness of the box, and to downsize the box by eliminating the conventional intermediate casing.

In addition, because the shorter and longer size fixing bars projecting from the inner surface of the top wall of the upper casing are inserted into the through-holes in the bus bar laminated unit, first printed circuit board, spacer, and second printed circuit board, it is easy to position the superimposed circuit components to one another, thereby increasing an accuracy in position of the terminals projecting from the bus bars, first and second printed circuit boards. It is possible to prevent the terminals from causing deformation or stress upon interconnecting the terminals.

Preferably, the second printed circuit board may be disposed below lower end surfaces of the shorter size fixing bars.

The second printed circuit board may be locked on the spacer by engaging pawls that project downward from a peripheral edge of the spacer.

That is, the spacer is secured to the upper casing by the shorter size fixing bars. When the engaging pawls on the spacer lock the peripheral edge of the second printed circuit board below the spacer, the first and second printed circuit boards can be firmly secured to the opposite sides (top and bottom surfaces) of the spacer without applying a direct load to the second printed circuit board.

In the case where the second printed circuit board is provided with through-holes for receiving screws and the lower ends of the shorter size fixing bars penetrate the through-holes and are secured to the spacer by the screws, it is possible to beforehand lock and secure the second printed circuit board to the spacer and to fasten the first screws after the shorter and longer size fixing bars are assembled to the spacer and second printed circuit board.

Preferably, the shorter size and longer size fixing bars may be formed into cylindrical configurations and provided in lower end openings with threaded holes to be engaged with the screws inserted upward. In order to pass these fixing bars, the circular through-holes are provided in the bus bar laminated unit, first and second printed circuit boards, spacer, and lower casing. Flange portions may be provided on the inner peripheral surfaces of the spacer and lower casing. One side of each flange portion defines a receiving surface for the distal end of each fixing bar, while the other side of each flange portion defines a receiving surface for the head portion of each screw. According to this structure, the through-holes can contain the heads of the screws, thereby preventing the heads from projecting out of the exterior of the spacer and lower casing.

Preferably, the shorter size fixing bars may be secured to the bus bar laminated unit, first printed circuit board, and spacer via through-holes provided in four corners of them. The longer size fixing bars may be secured to the bus bar laminated unit, first and second printed circuit board, spacer and lower casing via through-holes provided in diagonal positions of them.

Preferably, the first printed circuit board is provided with a first conductor pattern for a high current, while the second printed circuit board is provided with a second conductor pattern for a middle or low current. The first and second printed circuit boards may be provided with terminals soldered on and projected from the first and second conductor patterns. The terminals may be project in a relay-containing section, a fuse-containing section, and/or a connector-containing section of the upper casing and/or the lower casing. A board relay may be mounted on an upper surface of the first printed circuit board to be connected to the first conductor pattern. Electronic and electrical parts may be mounted on the opposite sides of the second printed circuit board to be connected to the second conductor pattern.

As described above, by providing different thicknesses, widths, or the like, to the first and second printed circuit boards, the first printed circuit board can be utilized as a printed circuit board for a high current circuit, and the second printed circuit board can be utilized as a printed circuit board for a middle or low current circuit. By interposing the spacer between the printed circuit boards, arrangement of them can be changed.

Thus, it is possible to simplify a connecting circuit by separating the printed circuit board for a high current circuit and the printed circuit board for a middle or low current circuit through the spacer, without providing conductors for a high current circuit and a middle or low current circuit to a single printed circuit board.

Preferably, the casing assembly is attached to a vehicle body in an inclined posture. The screws for the lower casing are disposed on bottom surfaces of recesses formed in a bottom wall of the lower casing. Lower side peripheral walls of the recesses may be inclined to define drain guide surfaces. Water barrier ribs may project around the recesses to surround upper edges and opposite side edges of the recesses.

In the case where the casing assembly is attached to the vehicle body in the inclined posture, as described above, water may enter into the recesses provided in the bottom wall of the lower casing. In this case, the water barrier ribs can prevent the water from entering into the recesses. Even if water enters into the recesses, the drain guide surfaces inclined downward can naturally and smoothly flow the water downward, thereby preventing water from flooding the recesses through the screw holes in the recess bottom surfaces of the electrical junction box.

As described above, in the electrical junction box of the present disclosure, the bus bar, first printed circuit board, second printed circuit board constituting an inner circuit component are superimposed on one another and disposed in the casing assembly including the upper and lower casings. The shorter size and longer size fixing bars projecting from the inner surface of the top wall of the upper casing can position and secure them to one another. In particular, the first and second printed circuit boards, are positioned away from each other through the spacer and positioned in the casing assembly without receiving the screw-fastening load directly.

Thus, because the present disclosure does not require the intermediate casing in comparison with the prior art disclosed in Japanese Patent No. 3888368, the present disclosure can reduce a count of components and decrease the thickness and size of the electrical junction box in comparison with the electrical junction box disclosed in Japanese Patent No. 3888368.

Because the screw-fastening load is not directly applied to the first and second printed circuit boards secured to the interior of the casing assembly, it is possible to surely prevent the soldered portions connecting the terminals or parts to the printed circuit boards from causing problems, such as cracks.

DETAILED DESCRIPTION OF EMBODIMENTS

Referring now to FIGS. 1 to 5, an embodiment of an electrical junction box in accordance with the present disclosure will be described below.

The electrical junction box is mounted in a motor vehicle so that the electrical junction box is inclined in the motor vehicle.

Figure 1:
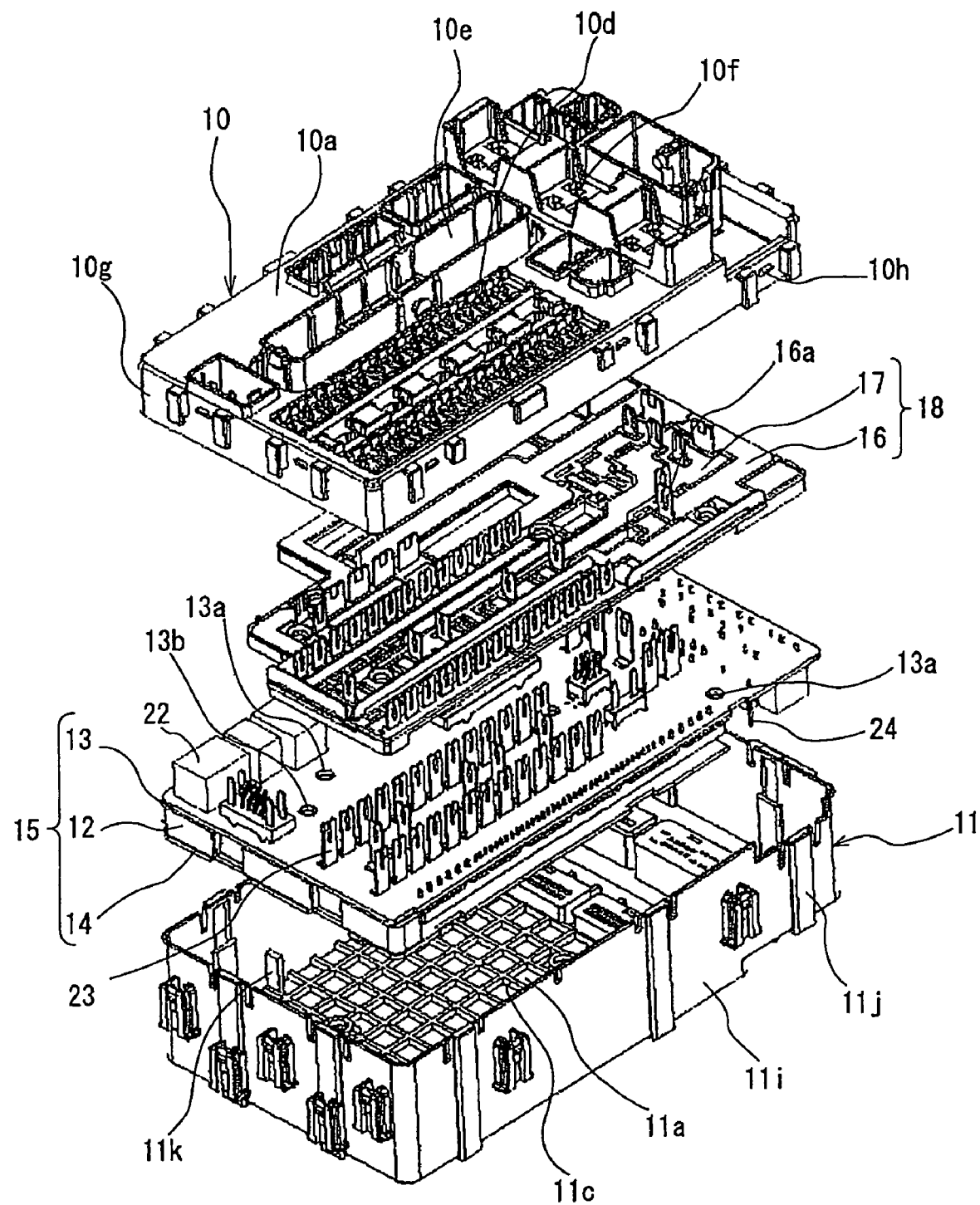
FIG. 1 is an exploded perspective view of an electrical junction box in accordance with an embodiment.
Figure 2A:
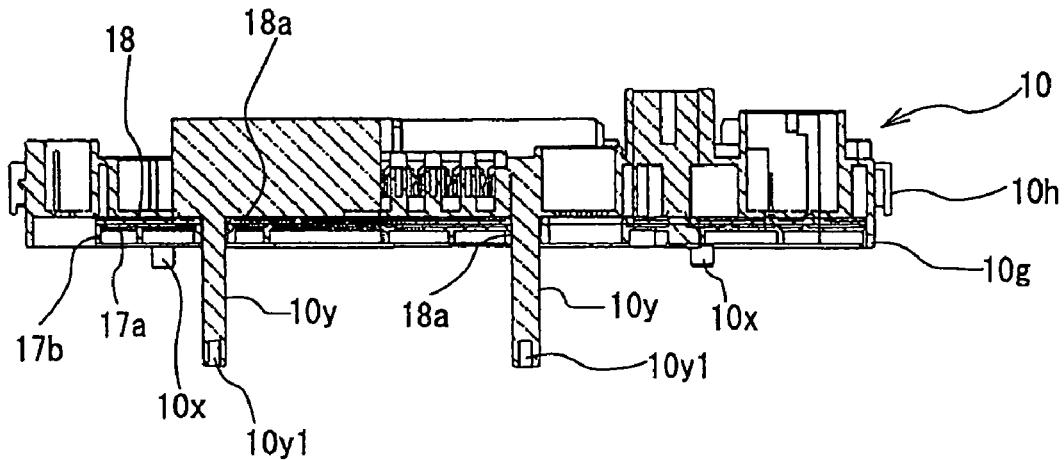
FIG. 2A is a sectional view of an upper casing, illustrating the upper casing to which a laminated unit including bus bars and insulation plates are attached.

As shown in FIGS. 1 and 2, the electrical junction box may include a casing assembly having an upper casing 10 and a lower casing 11. A bus bar laminated unit 18, in which bus bars 16 and insulation plates 17 are alternately laminated, and a printed circuit board unit 15 including a first printed circuit board 13, a spacer 12, and a second printed circuit board 14 may be contained in the casing assembly so that they are arranged from the upper casing 10 to the lower casing 11.

Shorter size fixing bars 10x may be integrated with an inner surface of a top wall 10a of the upper casing 10 and may extend downward from the inner surface. The shorter size fixing bars 10x may penetrate the bus bar laminated unit 18, first printed circuit board 13, and spacer 12 to fix them on the upper casing 10 by first screws N1. Longer size fixing bars 10y may penetrate the bus bar laminated unit 18, first printed circuit board 13, spacer 12, second printed circuit board 14, and lower casing 11 to fix them on the lower casing 11 by second screws N2.

Two cylindrical longer size fixing bars 10y may extend from an inner surface on the top wall of the upper casing 10 substantially at the opposite sides of a center of the top wall in a diagonal direction. Four shorter size fixing bars 10x may extend at the corners of the top wall. A length of each longer size fixing bar 10y may be set to reach a bottom wall 11a of the lower casing 11, while a length of each shorter size fixing bar 10x may be set to reach a base portion 12a of the spacer 12. The shorter size fixing bars 10x may be covered with the second printed circuit board 14 at the lower surface side of the spacer 12. The longer size and shorter size fixing bars 10y and 10x may be formed into cylindrical configurations and may be provided with threaded holes 10y1 and 10x1 at their lower end openings.

The spacer 12 may be disposed between the first printed circuit board 13 and the second printed circuit board 14 and may be a product made of an insulation resin material and having a configuration shown in FIG. 2. The spacer 12 may include a substantially rectangular base portion 12a and an outer peripheral frame 12d that projects in a vertical direction from an outer peripheral edge of the base portion 12a.

Figure 2B:
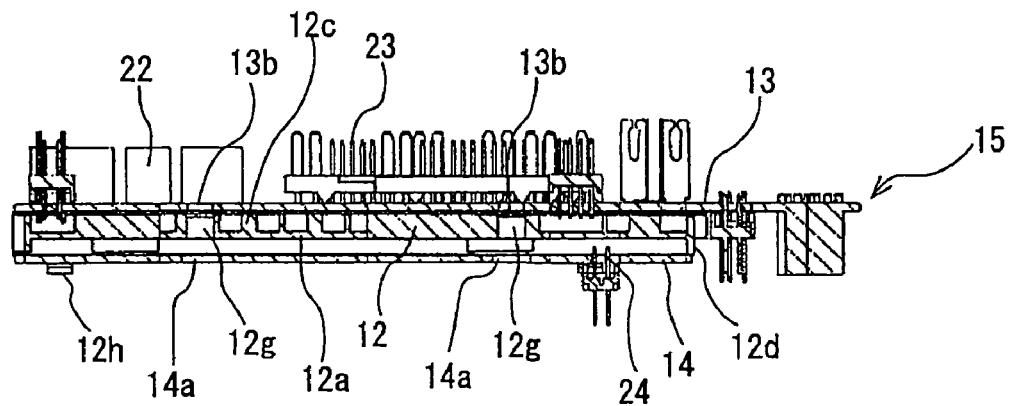
FIG. 2B is a sectional view of a board unit.

The base portion 12a may be provided substantially on a whole top surface with substantially grid-like ribs 12c for reinforcement and prevention against deformation. As shown in FIG. 2B, the first printed circuit board 13 may be disposed on top surfaces of the ribs 12c. The base portion 12a may not be provided on a bottom surface with the ribs 12c. The second printed circuit board 14 may be disposed on a bottom surface of the outer peripheral frame 12d.

Thus, the reinforcement ribs 12c may be provided on the top surface of the base portion 12a to reinforce the whole spacer and to prevent the spacer from causing any shrinkage holes or cambers. The ribs 12c may be formed on the opposite sides of the spacer 12.

Figure 3A:
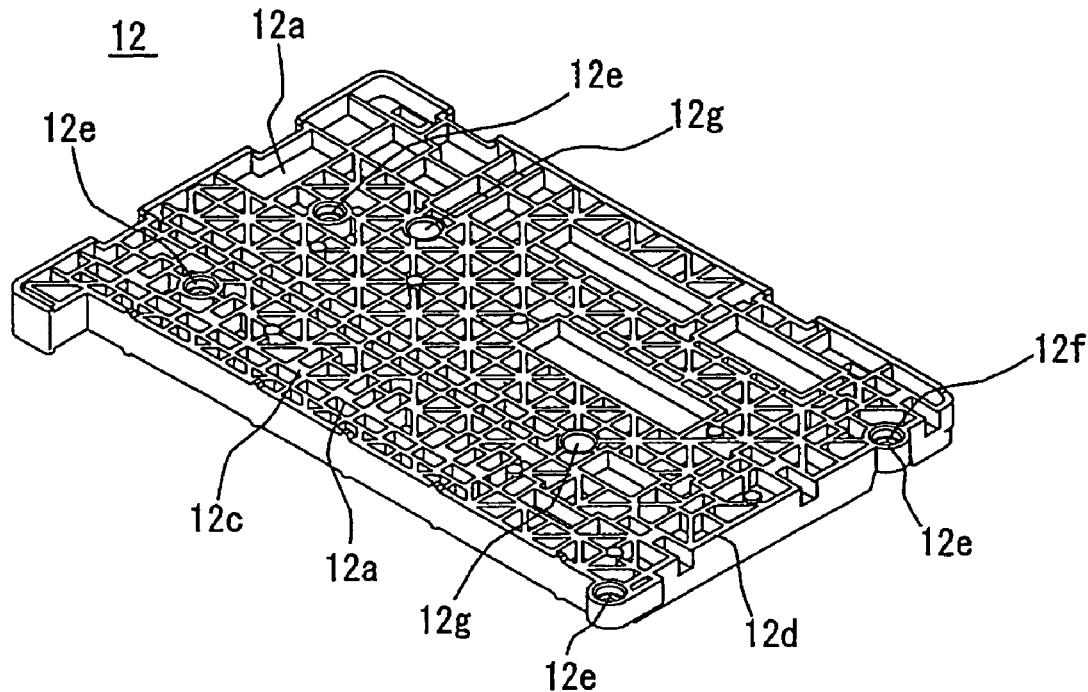
FIG. 3A is a perspective view of a spacer.
Figure 3B:
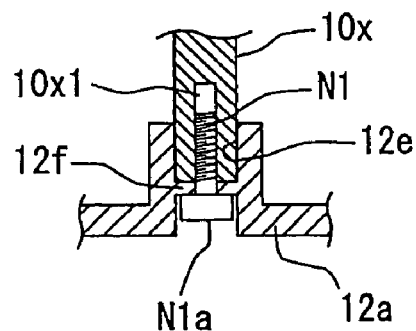
FIG. 3B is an enlarged sectional view of a main part of the spacer.
Figure 3C:
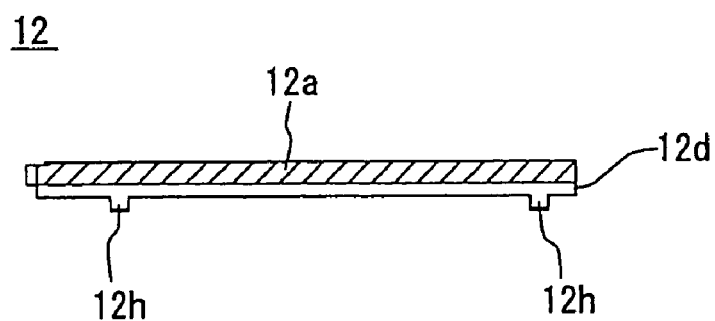
FIG. 3C is a longitudinal sectional view of the spacer taken along a long side of the spacer in FIG. 3A.

As shown in FIG. 3A, the base portion 12a of the spacer 12 may be provided with through-holes 12e in four positions corresponding to the projecting positions of the four shorter size fixing bars 10x. As shown in FIG. 3B, each of the through-holes 12e may be provided on an interior with an annular flange portion 12f. A top surface of the flange portion 12f may receive a lower end surface of the shorter size fixing bar 10x, while a bottom surface of the flange portion 12f may receive a head portion N1a of the first screw N1 inserted upward into the through-hole 12e.

Furthermore, the spacer 12 may be provided with two through-holes 12g at the positions corresponding to the projecting positions of two longer size fixing bars 10y.

In addition, engaging pawls 12h (FIG. 3c) may extend from a lower end surface on a downward projecting portion of the outer peripheral frame 12d of the spacer 12. The second printed circuit board 14 may contact with a lower end surface of the outer peripheral frame 12d. The engaging pawls 12h may lock the peripheral edge of the second printed circuit board 14.

As shown in FIGS. 1 and 2B, the first printed circuit board 13 to be disposed on the top surface of the spacer 12 may be provided with through-holes 13a and 13b that permit the shorter size fixing bars 10x and the longer size fixing bars 10y to penetrate. On the other hand, the second printed circuit board 14 to be disposed on the bottom surface of the spacer 12 may be provided with through-holes 14a that permit the longer size fixing bars 10y to penetrate.

The first printed circuit board 13 may be provided with a conductor path (conductor pattern) having a great thickness enough to constitute a printed circuit board for a high current circuit.

The second printed circuit board 14 may be provided with a conductor path having a smaller thickness than that of the first printed circuit board 13 enough to constitute a printed circuit board for a middle or low current circuit.

As shown in FIG. 1, the first printed circuit board 13 may be provided on the top surface with a board relay 22 disposed along a part of the peripheral edge of the top surface and may be provided on the top surface with a number of terminal members 23 soldered on the conductor path.

Figure 4:
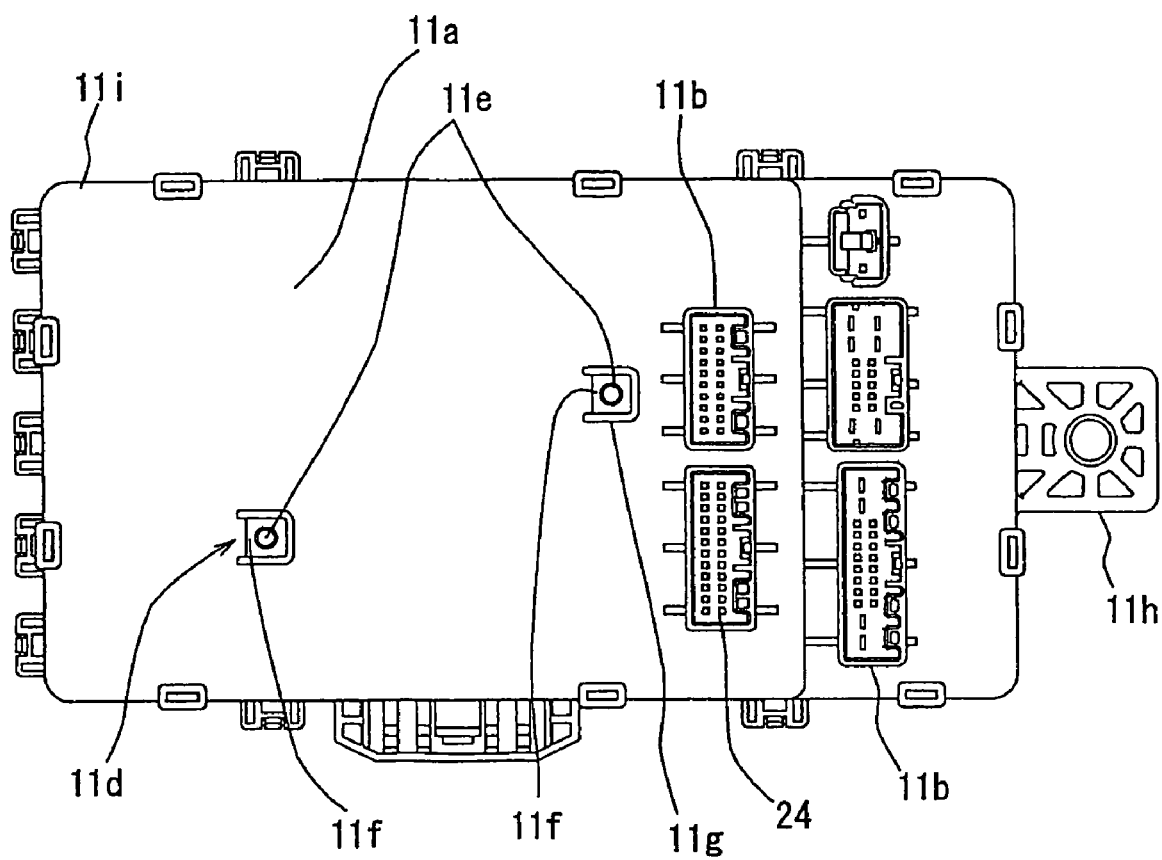
FIG. 4 is a bottom view of the lower casing.

The second printed circuit board 14 may be provided with electronic/electrical elements on the top surface that is opposed to and spaced away from the base portion 12a of the spacer 12 and on the bottom surface that is opposed to the bottom surface of the lower casing 11. The electronic/electrical elements may be connected to the conductor paths on the printed circuit board 14. Terminal members 24 are soldered on the conductor paths on the opposite sides of the second printed circuit board 14 to project toward a connector-containing section 11b in the lower casing 11, as shown in FIG. 4.

The upper casing 10 may be provided on the top wall 10a with a fuse-containing section 10d, a connector-containing section 10e, and a relay-containing section 10f to dispose terminals 16a projecting from the bus bars 16, and the terminal members 23 projecting from the first printed circuit board 13 in the respective sections. The lower casing 11 may be provided on the bottom wall with a connector-containing section 11b to dispose the terminal members 24 projecting from the second printed circuit board 14 in the section 11b.

The upper casing 10 may be provided on an exterior of a peripheral wall 10g with a locking portion 10h to be locked on the lower casing 11.

The lower casing 11 may be provided substantially on a whole top surface of the bottom wall 11a with grid-like ribs 11c for reinforcement and on an outer peripheral portion of the bottom wall 11a with longer size ribs 11k extending upward. Upper end surfaces of the longer size ribs 11k may contact with the bottom surface of the second printed circuit board 14 to perform positioning and holding functions. Recesses 11d may be provided in the bottom wall 11a of the lower casing 11 at the positions opposed to the projecting positions of the longer size fixing bars 10y. Each of the recesses 11d may be provided on a bottom wall with a through-hole 11e to pass the second screw N2. Lower surfaces of the longer size fixing bars 10y may be put on upper surfaces of the recesses 11d. The lower surface of each recess 11*d* may serve as an engaging surface with a head portion N2*a* of the second screw N2 to be inserted into the through-hole 11*e* from the lower side.

Figure 5:
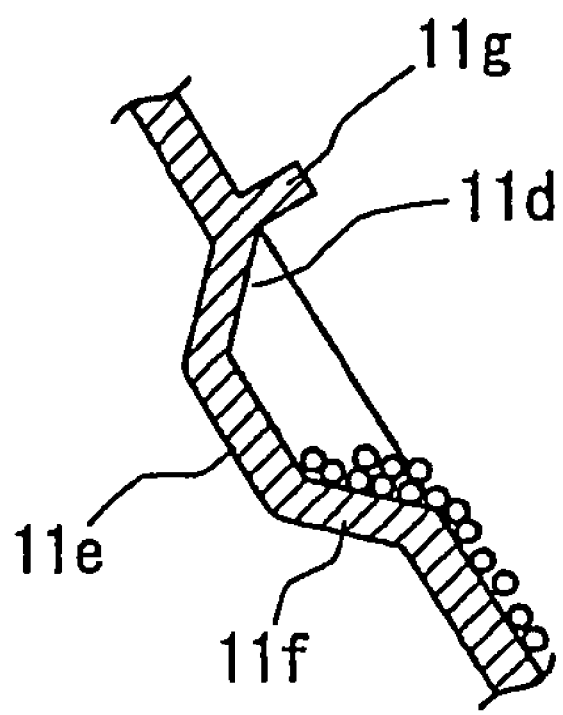
FIG. 5 is a sectional view of a main part of the lower casing.
Figure 6:
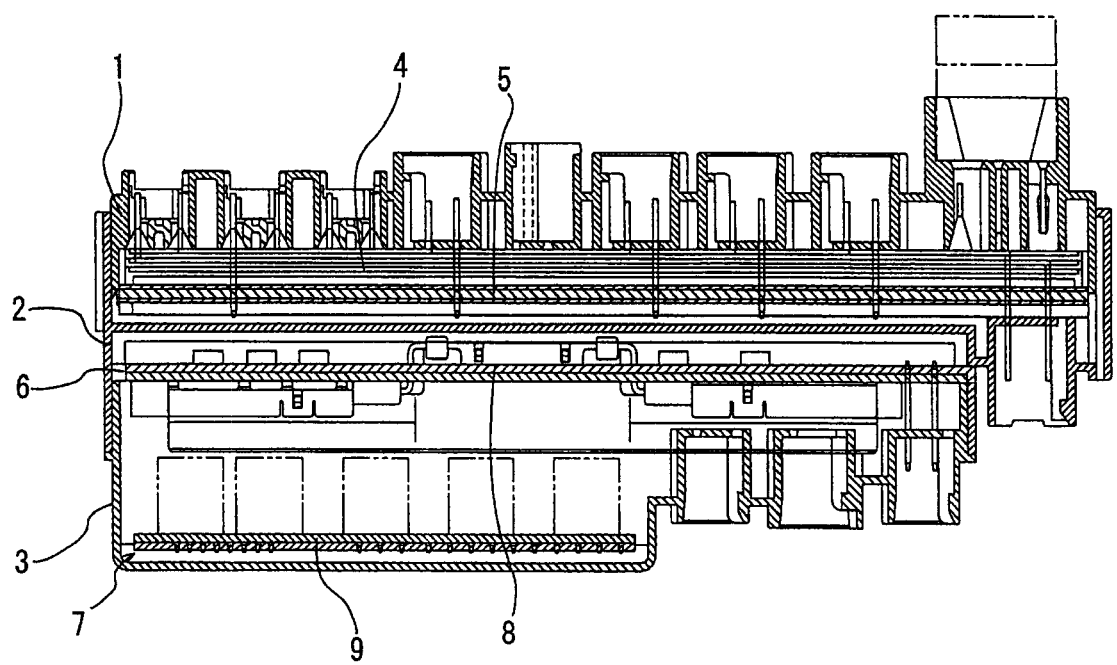
FIG. 6 is a longitudinal sectional view of a conventional electrical junction box.
Figure 7:
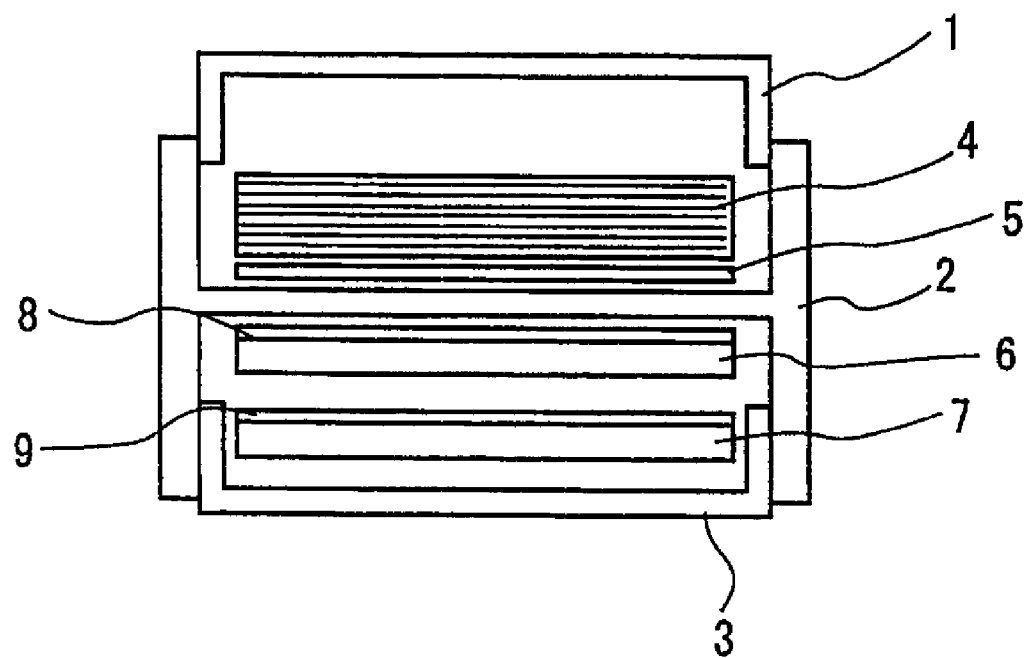
FIG. 7 is a sectional view of FIG. 6, illustrating problems of the conventional electrical junction box.

As shown in FIGS. 4 and 5, a peripheral wall of each recess 11*d* may be inclined to define a drain guide surface 11*f*. A rib 11*g* surrounds three sides of the recess 11*d* except the drain guide surface 11*f*.

In the embodiment of the electrical junction box, a bracket 11*h* to be secured to the vehicle body may project from a peripheral wall 11*i* of the lower casing 11. When the bracket 11*h* is attached to a vehicle body, the electrical junction box may be held in an inclined posture. Consequently, the bottom wall 11*a* of the lower casing 11 may be held in the inclined posture, as shown in FIG. 5.

Accordingly, as described above, because the drain guide surface 11*f* and rib 11*g* are provided on each recess 11*d*, the rib 11*g* can prevent water from entering into the recess 11*d*. Even if water enters into the recess 11*d*, the water will fall down naturally along the inclined drain guide surface 11*f*.

Figure 2C:
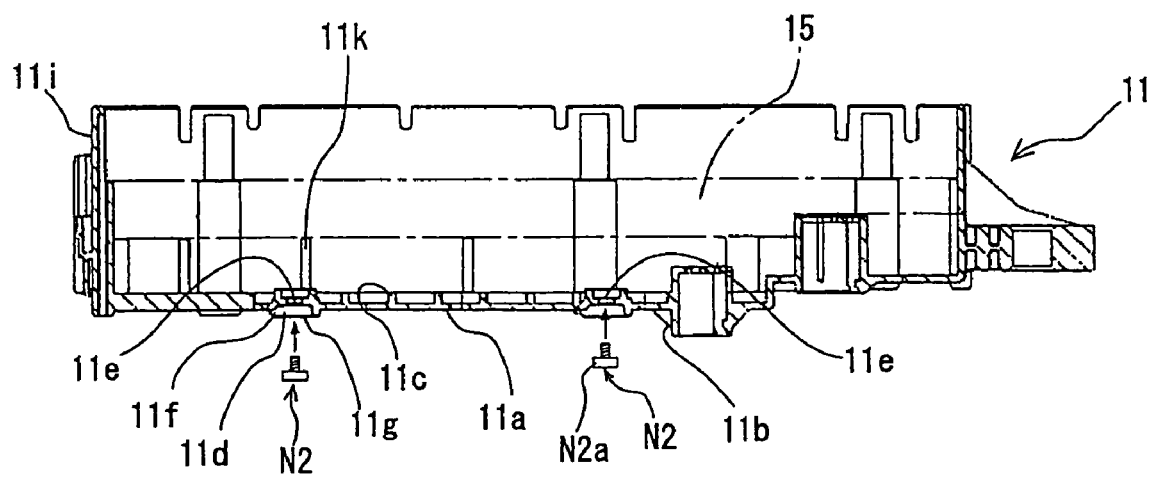
FIG. 2C is a sectional view of a lower casing.

As shown in FIG. 1 and FIG. 2C, the peripheral wall 11*i* of the lower casing 11 may have a height that reaches a top surface of the electrical junction box and thus the lower casing 11 may be formed into a deep box-like configuration. When the peripheral wall 11*i* of the lower casing 11 is fitted on the exterior of the peripheral wall 10*g* of the upper casing 10, the locking portions 10*h* on the exterior of the peripheral wall 10*g* may engage with the locked portion 11*j* provided on the peripheral wall 11*i*.

Next, procedures for assembling the electrical junction box will be described below.

Firstly, the upper casing 10 is turned in an upside down position so that the shorter size fixing bars 10*x* and longer size fixing bars 10*y* may project upward, the bus bar laminated unit 18 including the bus bars 17 and insulation plates 16 is inserted into the upper casing 10. The longer size fixing bars 10*y* and shorter size fixing bars 10*x* may be inserted into the through-holes 18*a* in the bus bar laminated unit 18 from the upper side. The bus bar laminated unit 18 may be contained in the upper casing 10.

Secondly, the first printed circuit board 13 is inserted into the upper casing 10 from the upper side. The shorter size and longer size fixing bars 10*x* and 10*y* projecting from the bus bar laminated unit 18 may be inserted into the through-holes 13*a* and 13*b* in the first printed circuit board 13 from the upper side. The first printed circuit board 13 may be disposed on the insulation plate 17 on the lowermost layer (uppermost layer in the assembling steps) of the bus bar laminated unit 18.

Then, the spacer 12 may be inserted into the upper casing 10 from the upper side. The longer size fixing bars 10*y* may be inserted into the through-holes 12*g* in the spacer 12. The shorter size fixing bars 10*x* may be inserted into the through-holes 12*e* in the spacer 12. The lower end surfaces (upper end surfaces in the assembling steps) of the shorter size fixing bars may contact with the flanges 12*f* in the through-holes 12*e*. Under this condition, the first screws N1 are inserted into the through-holes 12*e* and screwed into the threaded holes 10*x*1 in the shorter size fixing bars 10*x*. The head portions N1*a* of the first screws N1 may contact with the bottom surfaces (top surfaces in the assembling steps) of the flanges 12*f*, and the head portions N1*a* may not project from the lower end surfaces (upper end surfaces in the assembling steps) of the spacer 12.

Thus, the bus bar laminated unit 18 may be contained in the upper casing 10 to project from the casing 10, and the first printed circuit board 13 and spacer 12 may be superimposed on and secured to the bus bar laminated unit 18.

Then, the second printed circuit board 14 may be inserted into the upper casing 10 from the upper side. The longer size fixing bars 10*y* may be inserted into the through-holes 14*a* in the second printed circuit board 14. The second printed circuit board 14 may be put on the distal end of the outer peripheral frame 12*d* of the spacer 12. The engaging pawls 12*h* projecting from the outer peripheral frame 12*d* may lock the second printed circuit board 14. Under this condition, the shorter size fixing bars 10*x* are covered with the second printed circuit board 14.

Finally, the lower casing 11 may be mounted on the upper casing 10 from the upper side. The peripheral wall 10*g* of the upper casing 10 may be fitted on the interior of the peripheral wall 11*i* of the lower casing 11. The lower end surfaces of the longer size fixing bars 10*y* may contact with the upper surfaces of the recesses 11*d* around the through-holes 11*e* in the lower casing 11. Under this condition, the second screws N2 are inserted into the through-holes 11*e* in the lower casing 11 from the upper side and screwed into the threaded holes 10*y*1 in the longer size fixing bars 10*y*. The peripheral wall 10*g* of the upper casing 10 may be fitted on the interior of the peripheral wall 11*i* of the lower casing 11. The locking portions 10*h* may couple the locked portions 11*j* to each other.

Thus, the assembled junction box may be turned in the upside down position so that the upper casing 10 may be disposed at the upper side while the lower casing 11 may be disposed at the lower side.

In the above assembling procedure, in the case where, for example, a step of stacking the first printed circuit board 13 on the second printed circuit board 14 may be carried out at a remote factory. The bus bar laminated unit 18, first printed circuit board 13 and spacer 12 can be firmly secured to the upper casing 10 by fastening the first screws N1 into the shorter size fixing bars. Accordingly, it is possible to prevent the respective components from being detached or shifted from one another when the assembled unit is transmitted to another remote factory.

The second printed circuit board 14 may be provided with large through-holes enough to loosely receive the first screws N1. After the second printed circuit board 14 is coupled to the spacer 12, the first screws N1 may be inserted via the through-holes in the second printed circuit board 14 and may be screwed in the shorter size fixing bars 10*x*.

In this case, it is possible to form a single unit 15 in which the first and second printed circuit boards 13 and 14 are stacked and fixed beforehand on each other through the spacer 12. Under this condition, the unit 15 can be attached to the upper casing 10.

In the electrical junction box constructed above, because the spacer 12 disposed between the first and second printed circuit boards 13 and 14 is coupled to the shorter size fixing bars 10*x* projecting from the inner surface of the upper casing 10 by fastening the first screws N1, a stress caused by a screw-fastening force is not directly applied to the first printed circuit board 13, thereby preventing the first printed circuit board 13 from causing problems, such as cracks, in a soldered portion. Because the engaging pawls that project from the outer peripheral frame 12*d* of the spacer 12 lock the second printed circuit board 14, a stress caused by a screw-fastening force is not applied to the second printed circuit board directly, thereby preventing problems, such as cracks, in soldered portion.

Furthermore, because the head portions N1*a* of the first screws N1 do not contact with the surface of the printed circuit board at all, it is possible to effectively utilize an area on the printed circuit board surface, to carry out an arrangement in a high density pattern, and to increase a mounting area of electronic elements. In addition, the head portions N2a of the second screws N2 attached to the lower casing 11 do not project outward. This will accomplish purposes of downsizing and slimming the electrical junction box.

Because the bus bar laminated unit 18, board unit 15 and lower casing 11 are positioned with respect to the longer size fixing bars 10y, and because they are fastened by the screws, the assembling work will be enhanced extensively.

The board unit 15 may be contained in the lower casing 11. The bus bar laminated unit 18 including the bus bars 16 and insulation plates 17 may be contained above the board unit 15 in the lower casing 11. The upper casing 10 may be mounted on the lower casing 11. This simplifies a structure of the electrical junction box. Because the electrical junction box of the present disclosure does not require an intermediate casing that has been required in the case of the electrical junction box of Japanese Patent No. 3,888,868, it is possible to simplify the interior structure of the electrical junction box and to reduce a thickness of the box.

Because the first printed circuit board 13 for a high current circuit and the second printed circuit board 14 for a middle or low current circuit are fixed on the opposite sides of the spacer 12, respectively, a support member for each printed circuit board is not required, the number of components can be reduced, and the electrical junction box can be downsized.

Furthermore, because the through-holes are provided in the bus bar laminated unit 18 including the bus bars and insulation plates, the first printed circuit board 13, the spacer 12, and the second printed circuit board 14, they are disposed in the casing assembly, and the shorter size and longer size fixing bars 10x and 10y project from the upper casing 10 and penetrate the through-holes to be fastened by the screws. An accuracy of positioning the bus bar laminated unit 18, first printed circuit board 13 and second printed circuit board 14 can be improved, and terminals projecting from the circuit elements are prevented from deforming or causing a stress upon interconnection of the terminals.

In addition, because the drain guide surfaces 11f and water barrier ribs 11g are provided around the through-holes 11e, it possible to surely prevent the water from entering the through-holes 11e in the lower casing 11.

What is claimed is:

1. An electrical junction box comprising: a casing assembly including an upper casing and a lower casing; a laminated unit including bus bars and insulation plates contained in the upper casing, and a first printed circuit board, a second printed circuit board, and a spacer contained in the lower casing, the spacer having a first side and a second side opposite from the first side, said first printed circuit board being disposed on the first side of said spacer and said second printed circuit board being disposed on the second side of said spacer; and shorter size fixing bars and longer size fixing bars projecting from an inner surface on a top wall of said upper casing, said shorter size fixing bars penetrating said laminated unit, said first printed circuit board and said spacer, screws being inserted upward into said shorter size fixing bars via through-holes in said spacer to secure said unit, said first printed circuit board, said spacer, and said lower casing to said shorter bars, and the longer size fixing bars penetrating said laminated unit, said first printed circuit board, said spacer, said second printed circuit board and said lower casing, and said screws being inserted upward into said longer size fixing bars via through-holes in said lower casing to secure said unit, said first and said second printed circuit boards and said spacer to said longer bars.

2. The electrical junction box according to claim 1, wherein said second printed circuit board is disposed below lower end surfaces of said shorter size fixing bars, and said second printed circuit board is locked on said spacer by engaging pawls that project downward from a peripheral edge of said spacer.

3. The electrical junction box according to claim 1,
wherein said first printed circuit board is provided with a first conductor pattern for a high current, while said second printed circuit board is provided with a second conductor pattern for a middle or low current, said first and second printed circuit boards are provided with terminals soldered on and projected from at least one of said first and second conductor patterns, said terminals project in a relay-containing section, a fuse-containing section, and a connector-containing section of at least one of said upper casing and said lower casing, and
wherein a board relay is mounted on an upper surface of said first printed circuit board to be connected to said first conductor pattern, and electronic and electrical parts are mounted on the opposite sides of said second printed circuit board to be connected to said second conductor pattern.

4. The electrical junction box according to claim 1,
wherein said casing assembly is attached to a vehicle body in an inclined posture, and
wherein said screws for said lower casing are disposed on bottom surfaces of recesses formed in a bottom wall of said lower casing, lower side peripheral walls of said recesses are inclined to define drain guide surfaces, and water barrier ribs project around said recesses to surround upper edges and opposite side edges of said recesses.

5. The electrical junction box according to claim 1, wherein the spacer is made of an insulation resin material.

\* \* \* \* \*